(12) United States Patent
Cheng

(10) Patent No.: US 7,898,027 B2
(45) Date of Patent: Mar. 1, 2011

(54) METAL-OXIDE-SEMICONDUCTOR DEVICE

(75) Inventor: Chih-Nan Cheng, I-Lan Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 502 days.

(21) Appl. No.: 11/778,628

(22) Filed: Jul. 16, 2007

(65) Prior Publication Data
US 2009/0020812 A1    Jan. 22, 2009

(51) Int. Cl.
*H01L 29/66* (2006.01)
(52) U.S. Cl. ... 257/337; 257/342; 257/492; 257/E29.256
(58) Field of Classification Search ................. 257/432, 257/337, 342, 492, E29.256
See application file for complete search history.

(56) References Cited

U.S. PATENT DOCUMENTS

| 6,169,309 B1 * | 1/2001 | Teggatz et al. ............ 257/328 |
| 6,933,569 B2 | 8/2005 | Koh |
| 2006/0186467 A1 * | 8/2006 | Pendharkar et al. ........ 257/337 |

FOREIGN PATENT DOCUMENTS

| TW | 1283030 | 6/2007 |
| TW | 1283910 | 7/2007 |

* cited by examiner

*Primary Examiner* — Eugene Lee
*Assistant Examiner* — Tucker Wright
(74) *Attorney, Agent, or Firm* — Winston Hsu; Scott Margo

(57) ABSTRACT

A MOS device includes a semiconductor substrate having a first conductive type, a source region, a gate structure, and a drain region having a second conductive type. The gate structure is formed on the semiconductor substrate and substantially parallel to a first direction. The source region and the drain region are both disposed in the semiconductor substrate, and on two opposite sides of the gate structure. The source region includes at least a source doped region having the second conductive type, and at least a source contact region having the first conductive type, and the source doped region and the source contact region are alternately arranged along the first direction.

11 Claims, 20 Drawing Sheets

METAL-OXIDE-SEMICONDUCTOR DEVICE

BACKGROUND OF THE INVENTION

1. Field of the Invention

The present invention relates to a semiconductor device, and more particularly, to a layout of a metal-oxide-semiconductor (MOS) device.

2. Description of the Prior Art

A MOS transistor device is one of the most common semiconductor devices, and is usually applied for enlarging currents or signals in a circuit, as being an oscillator of a circuit, or as being a switch device of a circuit. Based on the development of semiconductor processes, the MOS transistors have been applied to high-power devices, in place of power bipolar transistors that have slower switching speeds and higher driving consumptions. Accordingly, vertical double-diffusion metal-oxide-semiconductor (VDMOS) devices and lateral-diffusion metal-oxide-semiconductor (LDMOS) devices have been introduced in recent years. It is an advantage of the VDMOS device that the usable area of its source region is larger. However, it is more difficult to integrate the manufacturing process of the VDMOS device with the current processes of integrated circuits. On the other hand, the advantage of the LDMOS device is that the process of fabricating the LDMOS device is simpler, and it is effortless to integrate the LDMOS device with the other integrated circuit devices because of its flatter structure.

Please refer to FIG. 1 through FIG. 3. FIG. 1 is a schematic diagram illustrating a layout of a prior art LDMOS device 50, FIG. 2 is a schematic cross-sectional diagram illustrating the LDMOS device 50 shown in FIG. 1 along a crossing line 6-6', and FIG. 3 is a stereoscopic side-view diagram illustrating the LDMOS device 50 shown in FIG. 1. In order to clearly illustrate the structure and simplify the description, positions of field oxide layers are not shown in FIG. 1, and positions of plugs are not shown in FIG. 2 and FIG. 3.

As shown in FIG. 1 through FIG. 3, a prior art LDMOS device 50 includes a P-type semiconductor substrate 10, an N-type well 12 disposed in the semiconductor substrate 10, a first field oxide layer 14 disposed on part of the surface of the N-type well 12, a gate structure 16 covering part of the first field oxide layer 14, a P-body region 18 disposed in the semiconductor substrate 10 on one side of the first field oxide layer 14, a source region 20 disposed within the P-body region 18, an N-type drain region 22 disposed within the N-type well 12 on one side of the first field oxide layer 14, an N-type grade doped region 52 disposed within the N-type well 12 under the drain region 22, a butting contact plug 36, and a plurality of contact plugs 46.

The source region 20 includes an N-type source doped region 32 and a P-type source contact region 34 therein. The source doped region 32 is disposed between the gate structure 16 and the source contact region 34. Observing along a direction parallel with the gate structure 16, the source doped region 32 does not overlap the source contact region 34. The gate structure 16 includes a gate dielectric layer 28, a gate electrode 26 and a spacer structure 30. The butting contact plug 36 electrically connects the source doped region 32 with the source contact region 34, and the contact plugs 46 are electrically connected to the gate electrode 26.

The prior art LDMOS device 50 further includes a P+ guard ring 40, two second field oxide layers 42, a high-voltage P-well 48, and a plurality of contact plugs 44. The high-voltage P-well 48 is disposed in the semiconductor substrate 10, and surrounds the components, such as the gate structure 16, the drain region 22, the source region 20, and the P-body region 18. The P+ guard ring 40 is disposed on the surface of the semiconductor substrate 10, and above the high-voltage P-well 48. The components, such as the gate structure 16, the drain region 22, the source region 20, and the P-body region 18, are also surrounded by the P+ guard ring 40. One of the second field oxide layers 42 surrounds the P+ guard ring 40 from the inner side of the P+ guard ring 40, while the other second field oxide layer 42 surrounds the P+ guard ring 40 from the outer side of the P+ guard ring 40. The contact plugs 44 are electrically connected to the P+ guard ring 40 so as to control the voltage of the P+ guard ring 40.

When a voltage applied to the gate electrode 26 is greater than the threshold voltage, the prior art LDMOS transistor 50 will be turned on. In a normal condition, the signal inputted from the drain region 22 flows through the N-type well 12, and reaches the source region 20. In such a case, the N-type well 12 disposed under the first field oxide layer 14 and under the gate electrode 26 can be regarded as a resistor. When the high voltage signal passes through the resistor, it will be converted into an applicable low voltage signal.

While the semiconductor technology is developed into the deep-submicron process, the requirements for higher performance of MOS transistor devices, and for higher integration levels of components are expected. However, the dimension of the prior art LDMOS device cannot decrease unlimitedly. The sizes of the regions located in the LDMOS device, such as the size of the gate region, the size of the source region, the size of the drain region, the size of the N-type well and the size of the P-type doped region, must be maintained above their critical size, so that the LDMOS device is able to suffer a high voltage. As a result, layout of the LDMOS device has a huge length, and the LDMOS device therefore occupies a great deal of area in the integrated circuit. The integration level of the integrated circuit is then seriously affected. On the other hand, since a drain-source on-state resistance (also named Rdson for short) value of an LDMOS device is proportional to its device area, the Rdson value of the prior art LDMOS device cannot reduce unlimitedly either. In light of this, it is still a great challenge for the device designer to reduce the length and the Rdson of the LDMOS device.

SUMMARY OF THE INVENTION

It is therefore a primary objective of the present invention to provide a MOS device having a shorter layout length and a smaller Rdson value so as to increase the integration level of the integrated circuit and the operating performance of the MOS device.

From one aspect of the present invention, a MOS device is disclosed. The MOS device includes a semiconductor substrate having a first conductive type, a gate structure, a drain region having a second conductive type, and a source region. The gate structure is disposed on the semiconductor substrate, and substantially parallel with a first direction. The drain region and the source region are both disposed in the semiconductor substrate, and the drain region and the source region are disposed on two opposite sides of the gate structure. The source region includes at least a source doped region having the second conductive type, and a plurality of source contact regions having the first conductive type. The source doped region is disposed on a side of the gate structure. The source contact regions and the source doped region are alternately arranged along the first direction.

From another aspect of the present invention, a MOS device is disclosed. The MOS device includes a semiconductor substrate having a first conductive type, a gate structure, a drain region having a second conductive type, a source region, and at least a butting contact plug. The gate structure is disposed on the semiconductor substrate. The drain region and the source region are both disposed in the semiconductor substrate, and the drain region and the source region are disposed on two opposite sides of the gate structure. The source region includes at least a source doped region having the second conductive type, and at least a source contact region having the first conductive type. The butting contact plug is disposed on the semiconductor substrate, substantially parallel with the gate structure, and contacts with both the source contact region and the source doped region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 4:
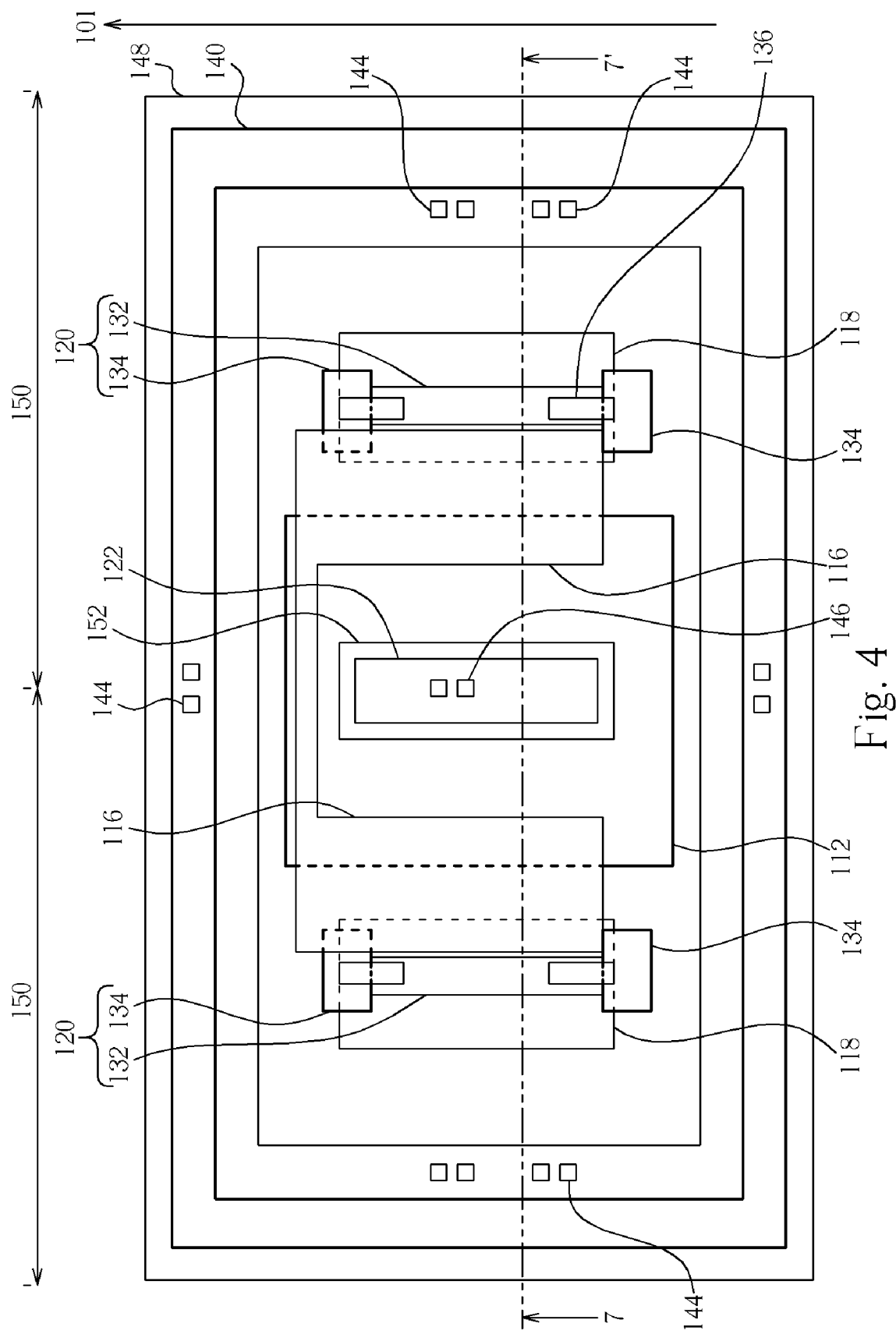
FIG. 4 is a schematic diagram illustrating a layout of an LDMOS device in accordance with a first preferred embodiment of the present invention.
Figure 5:
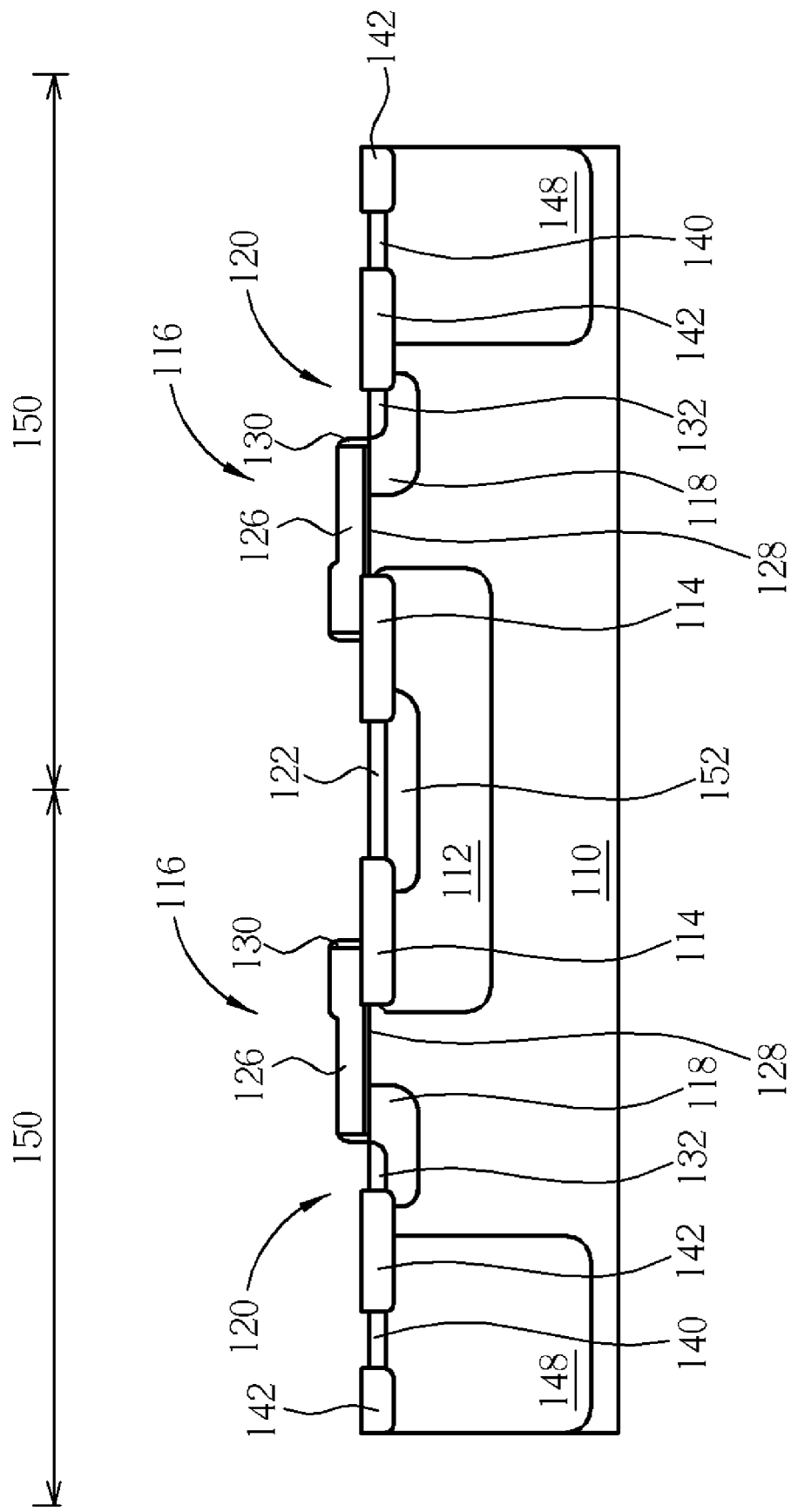
FIG. 5 is a schematic cross-sectional diagram illustrating the LDMOS device shown in FIG. 4 along a crossing line 7-7'.
Figure 6:
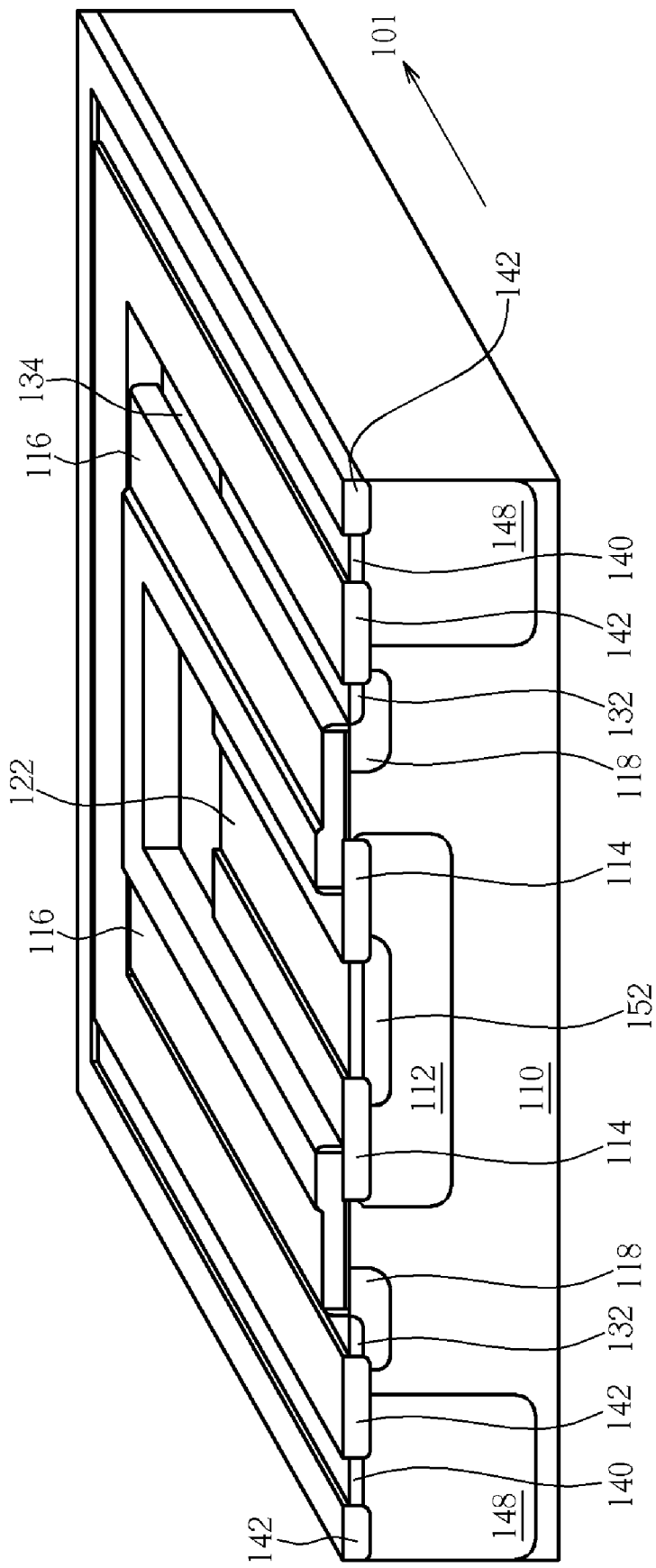
FIG. 6 is a stereoscopic side-view diagram illustrating the LDMOS device shown in FIG. 4.

Please refer to FIG. 4 through FIG. 6. FIG. 4 is a schematic diagram illustrating a layout of an LDMOS device 150 in accordance with a first preferred embodiment of the present invention, FIG. 5 is a schematic cross-sectional diagram illustrating the LDMOS device 150 shown in FIG. 4 along a crossing line 7-7', and FIG. 6 is a stereoscopic side-view diagram illustrating the LDMOS device 150 shown in FIG. 4. It is to be understood that the drawings are not drawn to scale and are served only for illustration purposes. Positions of isolation structures included in the LDMOS device 150 are shown in FIG. 5 and FIG. 6. However, in order to highlight the features of the present invention, positions of the isolation structures are not shown in FIG. 4. The structure of this embodiment should still be understood by a person skilled in this art according to the description and the drawings of this embodiment. In addition, positions of contact plugs and positions of butting contact plugs are shown in FIG. 4, while the contact plugs and the butting contact plugs are not shown in FIG. 5 and FIG. 6. A symmetrical semiconductor device including two LDMOS devices is taken as an example in this embodiment. Therefore, the two LDMOS devices share a drain, and one of the LDMOS devices is a mirror image of the other. However, the present invention should not be limited to the symmetrical semiconductor device including two LDMOS devices. The present invention can be applied to MOS devices having various layouts, such as a single LDMOS device, a structure including three LDMOS devices, or a MOS device of another type. In addition, the first conductive type is P-type, and the second conductive type is N-type in this embodiment. However, the first conductive type can be N-type, and the second conductive type can be P-type in other embodiment.

As shown in FIG. 4 through FIG. 6, the LDMOS device 150 in this embodiment includes a semiconductor substrate 110 having a first conductive type, a first well type, 112 having a second conductive type, a first isolation structure 114, a gate structure 116, a second well 118 having the first conductive type, a source region 120 disposed in the second well 118, a drain region 122 having the second conductive type, a grade doped region 152 having the second conductive type, at least a contact plug 146, and at least a butting contact plug 136. For example, one LDMOS device 150 includes two butting contact plugs 136 in FIG. 4. The source region 120 includes at least a source doped region 132 having the second conductive type, and at least a source contact region 134 having the first conductive type therein. The source contact region 134 is disposed in front of the source doped region 132, or in back of the source doped region 132. For instance, a source region 120 includes two source contact regions 134 therein in FIG. 4, and the two source contact regions 134 are disposed on two opposite sides of the source doped region 132. The gate structure 116 includes a gate dielectric layer 128, a gate electrode 126 and a spacer structure 130.

The gate structure 116 is disposed on the semiconductor substrate 110, and substantially parallel with a first direction 101, as shown in FIG. 6. The drain region 122 and the source region 120 are both located in the semiconductor substrate 110, and on two opposite sides of the gate structure 116 respectively. The first well 112 is disposed in the semiconductor substrate 110, and covers the bottom portions of the grade doped region 152 and the drain region 122. The first isolation structure 114 can be disposed on the top portion of the first well 112, and positioned between the drain region 122 and the source region 120. In other words, the bottom portion of the first isolation structure 114 is covered by the first well 112. The first isolation structure 114 in this embodiment is a field oxide layer. However, the isolation structure 114 is not limited to the field oxide layer, and can be other isolation structures, such as a shallow trench isolation (STI) structure.

The second well 118 is disposed in the semiconductor substrate 110 on one side of the isolation structure 114 opposite to the drain region 122, and covers the bottom portion of the source region 120. The gate dielectric layer 128 is disposed on the surface of the semiconductor substrate 110, between the first isolation structure 114 and the source region 120. The gate electrode 126 is disposed on the gate dielectric layer 128 and on a portion the first isolation structure 114. The spacer structure 130 surrounds partial sidewalls of the gate electrode 126 and the gate dielectric layer 128. The grade doped region 152 is a shallow doped region disposed in the first well 112 under the drain region 122. The contact plugs 146 are disposed on the surface of the gate electrode 126, and are electrically connected to the gate electrode 126 so as to control the voltage of the gate.

The LDMOS device 150 can further include a guard ring 140 having the first conductive type, two second isolation structures 142, a high-voltage well 148 having the first conductive type, and a plurality of contact plugs 144. The high-voltage well 148 is disposed in the semiconductor substrate 110, and surrounds the components, such as the gate structure 116, the drain region 122, the source region 120, and the second well 118. The guard ring 140 is positioned on the surface of the semiconductor substrate 110, and above the high-voltage well 148. The guard ring 140 also surrounds the components, such as the gate structure 116, the drain region 122, the source region 120, and the second well 118. One of the second isolation structures 142 is positioned inside the guard ring 140, while another second field oxide layer 42 surrounds the guard ring 140 from the outer side of the guard ring 140. The contact plugs 144 are positioned on the surface of the guard ring 140, and are electrically connected to the guard ring 140 so as to control the voltage of the high-voltage well 148. The drain region 122, the source contact regions 134, the source doped region 132, and the guard ring 140 are all heavy doped region.

It should be noted that the source contact regions 134 and the source doped region 132 are alternately arranged along the first direction 101 in the present invention. In other words, the source contact regions 134 and the source doped region 132 are alternately arranged along the extended direction of the channel width of the LDMOS device 150, and the two source contact regions 134 are disposed on two opposite sides of the source doped region 132 respectively. Because the source contact regions 134 and the source doped region 132 can be alternately arranged along the first direction 101, each of the butting contact plugs 136 can be disposed on the semiconductor substrate 110, substantially parallel with the gate structure 116, and each of the butting contact plugs 136 contacts with both the source contact regions 134 and the source doped region 132. In other words, the source contact regions 134 and the source doped region 132 can be alternately arrange along the direction of the butting contact plugs 136, so that the butting contact plug 136 can electrically connect the source contact regions 134 with the source doped region 132.

In the present invention, the direction of the line 7-7', which is also the extended direction of the channel length of the LDMOS device 150, is defined as the length direction of the LDMOS device 150. While length of the first well 112, length of the first isolation structure 114, length of the gate structure 116, length of the drain region 122, length of the shallow doped region 138 and length of the source doped region 132 are unchanged, and distances between these components are not changed either, length of the source region 120 and length of the second well 118 are decreased because of the positions of the source contact regions 134. The source contact regions 134 are removed from a position, which is on a side of the source doped region 132 opposite to the gate structure 116, to a position, which is in front of the source doped region 132, or in back of the source doped region 132.

Figure 1:
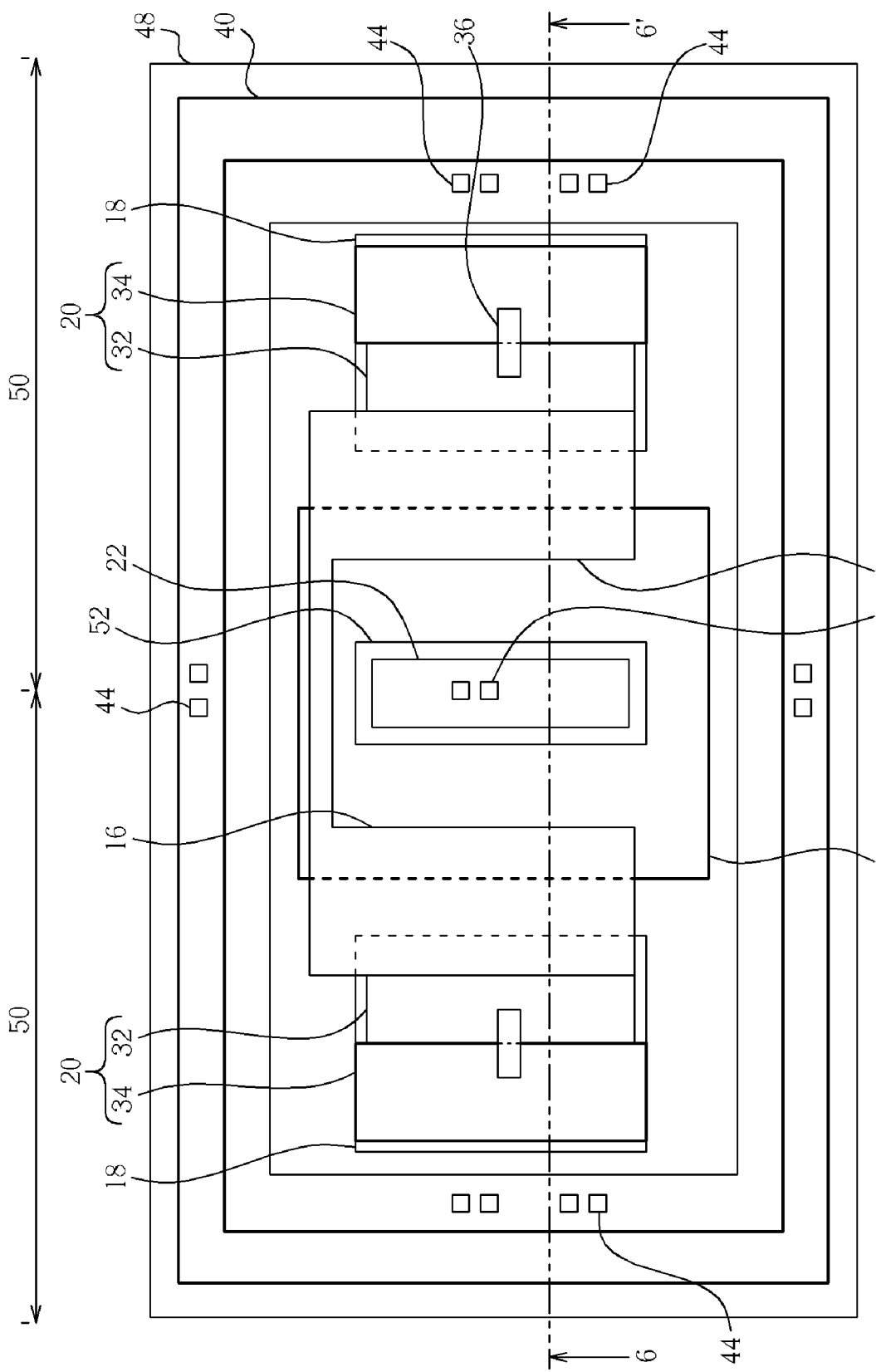
FIG. 1 is a schematic diagram illustrating a layout of a prior art LDMOS device.
Figure 2:
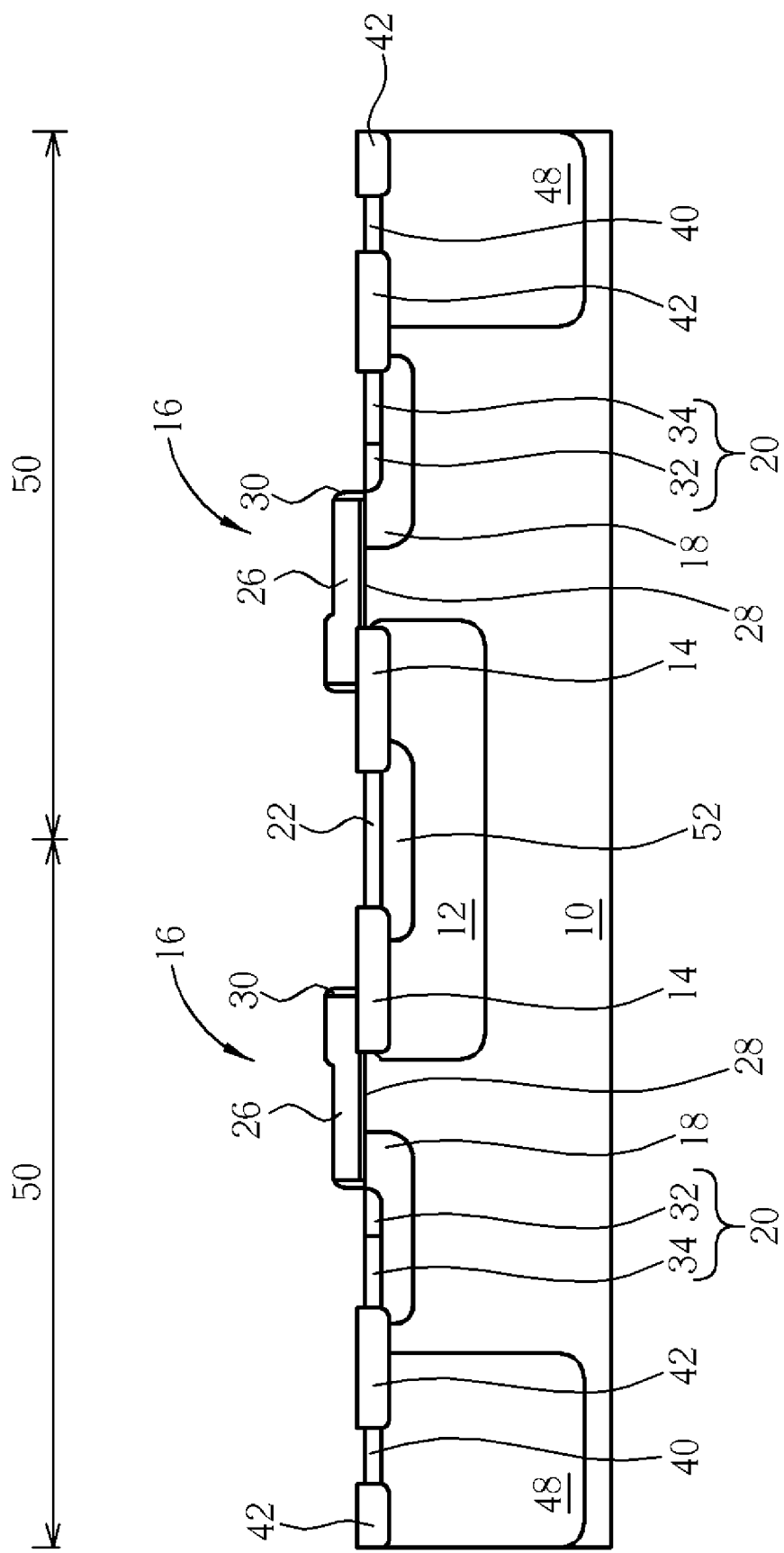
FIG. 2 is a schematic cross-sectional diagram illustrating the LDMOS device shown in FIG. 1 along a crossing line 6-6'.
Figure 3:
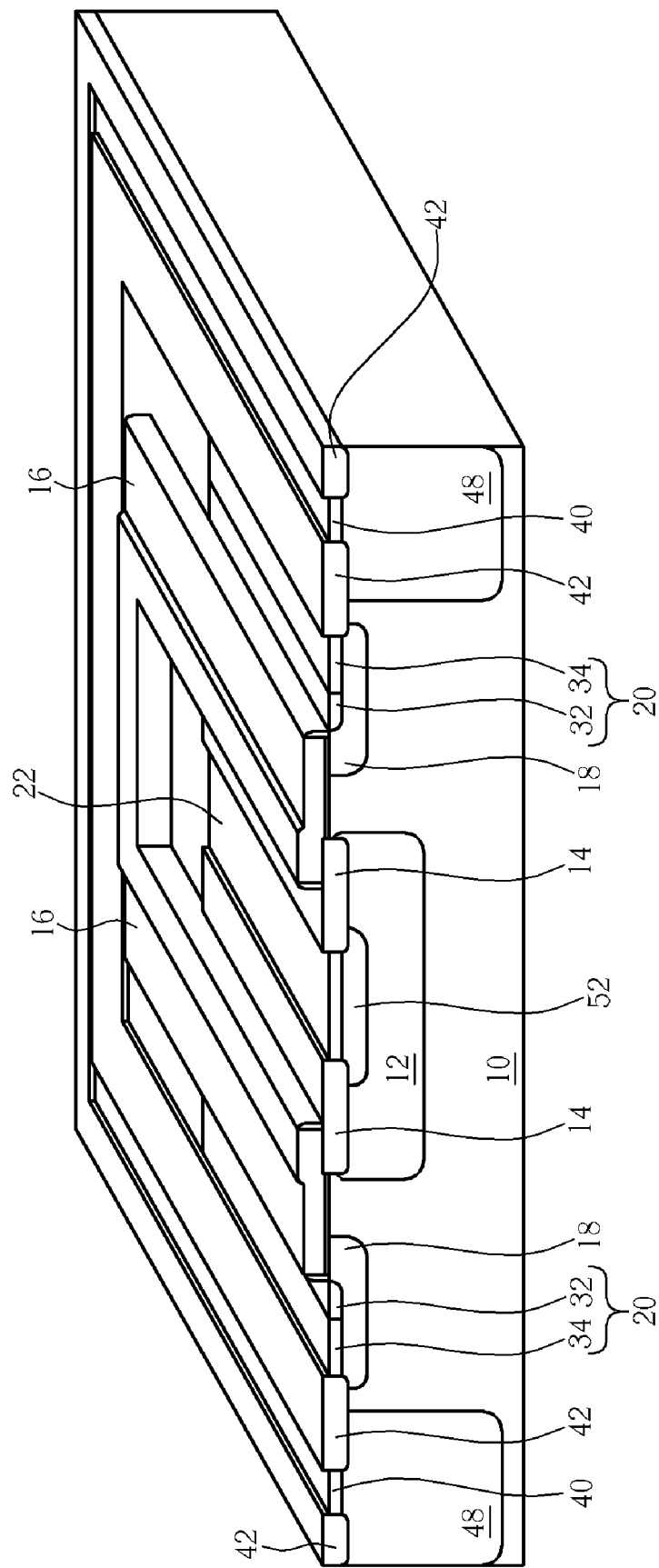
FIG. 3 is a stereoscopic side-view diagram illustrating the LDMOS device shown in FIG. 1.

Specifically speaking, the layout of the prior art LDMOS device, such as the LDMOS device 50 shown in FIG. 1 through FIG. 3, a source contact region is formed on a side of each source doped region opposite to the gate structure, and the length of each source contact region is approximately 0.9 micrometers. Accordingly, the LDMOS device 150 in this embodiment can save 1.8 micrometers in length as shown in FIG. 4. Thus, the LDMOS device 150 of the present invention can have a shorter layout length, and the integration level of the integrated circuit is therefore increased.

Figure 7:
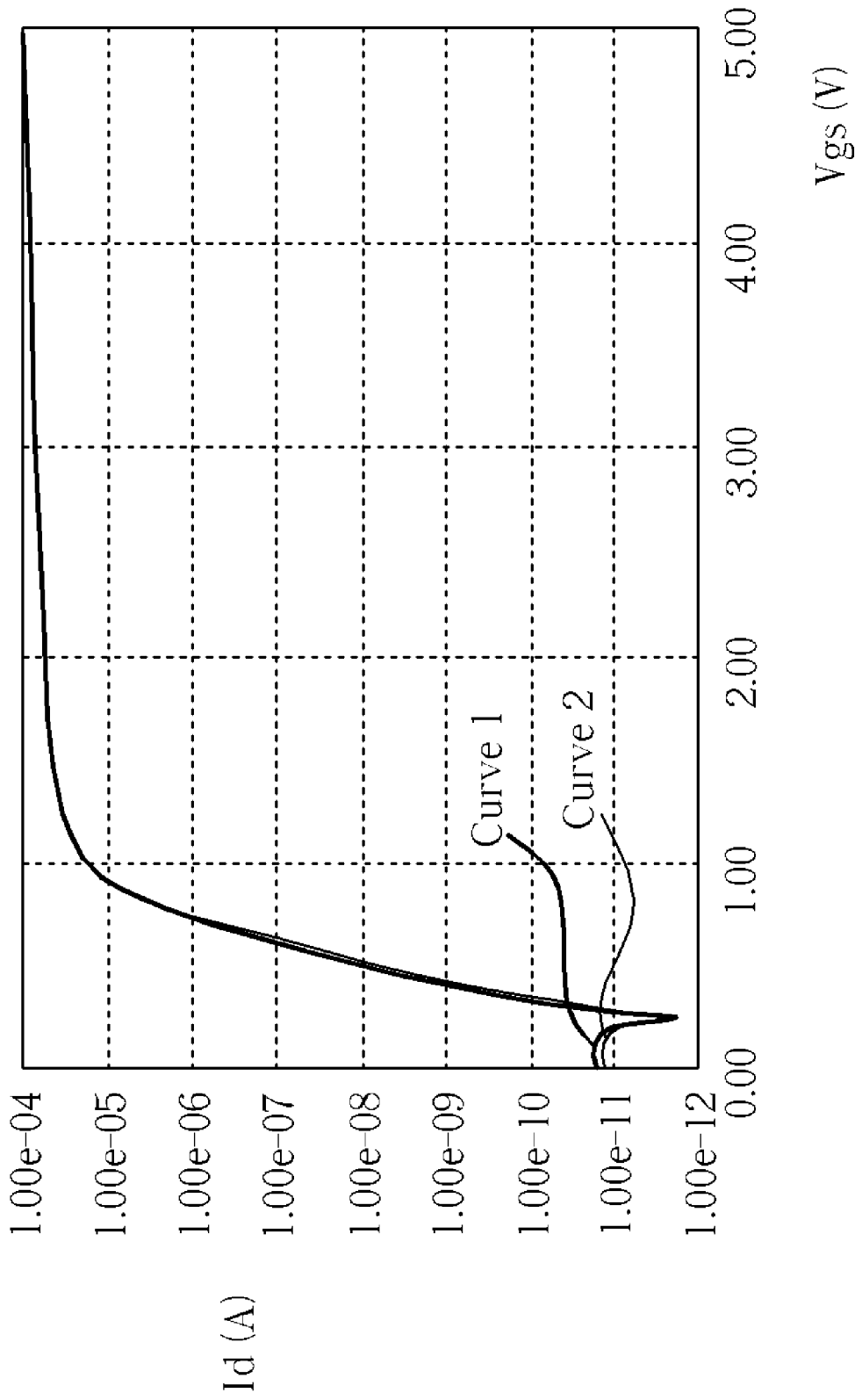
FIG. 7 and FIG. 8 are diagrams illustrating the relationship between the current and the voltage measured from LDMOS devices.
Figure 8:
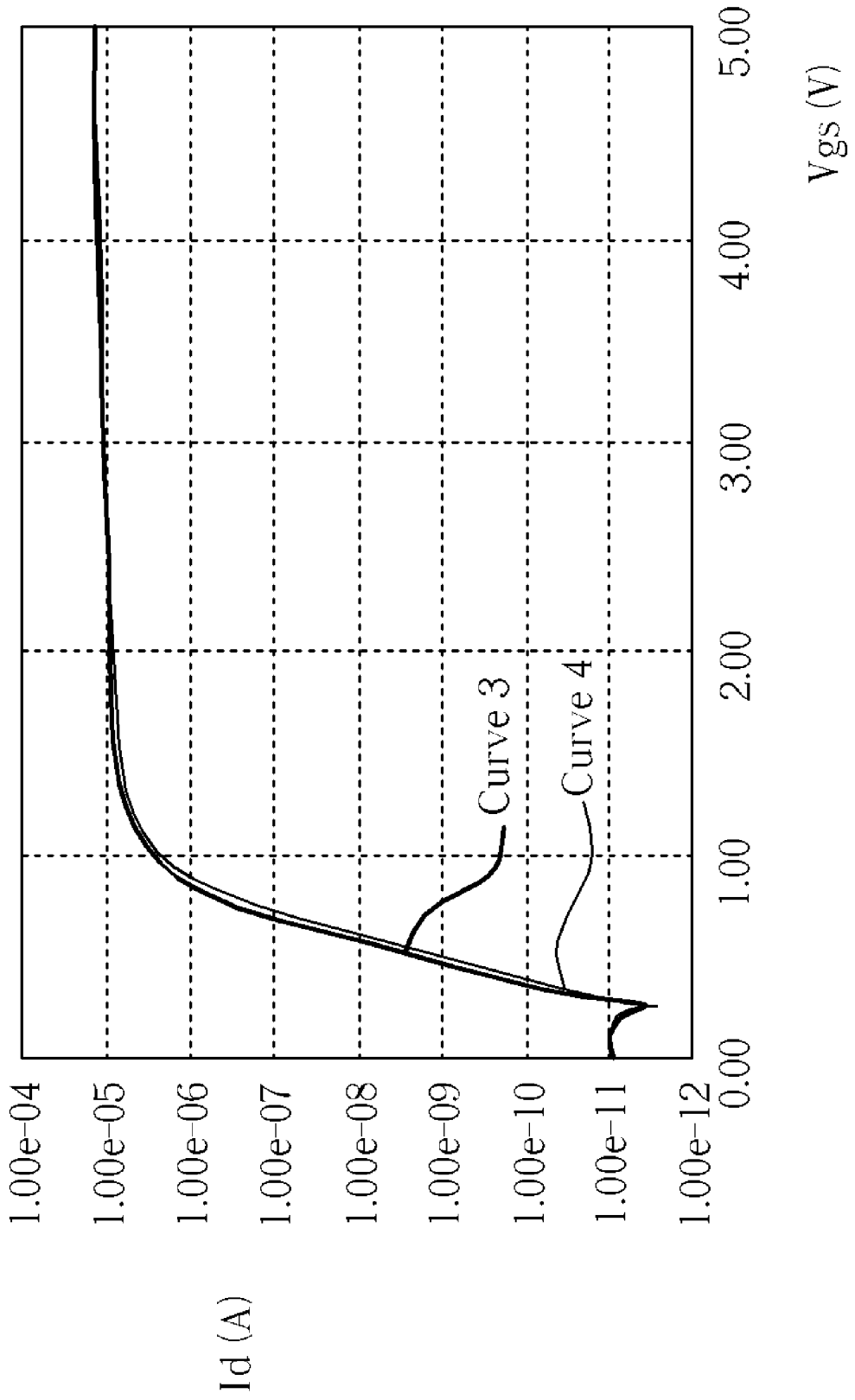

The layout of the LDMOS device 150 will not damage the operation of the LDMOS device 150. In addition, the layout of the present invention can even reduce the Rdson value of the LDMOS device 150, and increases the performance of MOS device 150. Please refer to FIG. 7 and FIG. 8. FIG. 7 and FIG. 8 are diagrams illustrating the relationship between the current and the voltage measured from LDMOS devices, where the voltage of the input signal for the LDMOS devices in FIG. 7 is 80 volts, and the voltage of the input signal for the LDMOS devices in FIG. 8 is 60 volts. In FIG. 7 and FIG. 8, the curve 1 and the curve 3 represent the relationship between the current and the voltage (usually called I-V curve) of the LDMOS device 150 in the present invention, and the curve 2 and the curve 4 represent the relationship between the current and the voltage (usually called I-V curve) of the prior art LDMOS device. The channel lengths of these LDMOS devices are all 3 micrometers, and the channel widths of these LDMOS devices are all 20 micrometers.

As shown in FIG. 7 and FIG. 8, the current value of the LDMOS device 150 in the present invention is larger than the current value of the prior art LDMOS device for the same voltage. According to a calculation from these data, the Rdson value of the prior art LDMOS device is 251.88 ohms under the input voltage of 80 volts, while the Rdson value of the LDMOS device 150 in the present invention is 244.15 ohms. In other words, the LDMOS device 150 of the present invention has a smaller Rdson. Additionally, the Rdson value of the prior art LDMOS device is 183.67 ohms under the input voltage of 60 volts, while the Rdson value of the LDMOS device 150 in the present invention is merely 179.71 ohms. Furthermore, it has been proved that the Rdson value of the LDMOS device 150 in the present invention will still be smaller than the Rdson value of the prior art LDMOS device when the channel widths of the LDMOS devices are 10 micrometers.

The main spirit of the present invention is that the positions or shapes of the source contact region or the source doped region is changed to shorten the total length of the source region, and the performance of the MOS device is protected in the meantime. Thus, the present invention should not be limited to the LDMOS device 150 shown in the above embodiment.

Figure 9:
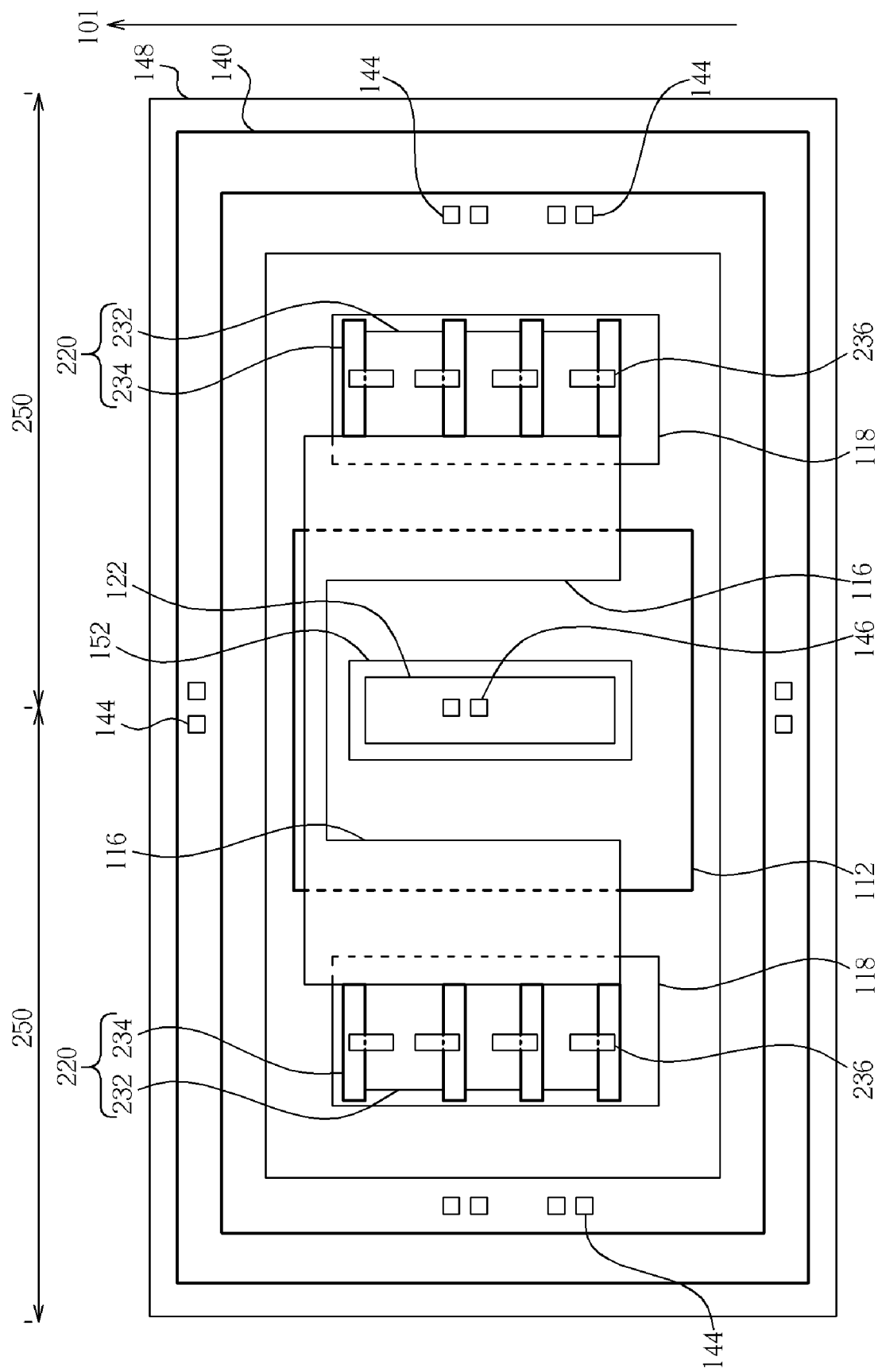
FIG. 9 is a schematic diagram illustrating a layout of an LDMOS device in accordance with a second preferred embodiment of the present invention.

Please refer to FIG. 9. FIG. 9 is a schematic diagram illustrating a layout of an LDMOS device 250 in accordance with a second preferred embodiment of the present invention. As shown in FIG. 9, the LDMOS device 250 in this embodiment includes a semiconductor substrate 110 having a first conductive type, a first well 112 having a second conductive type, a first isolation structure (not shown in the drawing), a gate structure 116, a second well 118 having the first conductive type, a source region 220 disposed in the second well 118, a drain region 122 having the second conductive type, a grade doped region 152 having the second conductive type, at least a contact plug 146, and a plurality of butting contact plugs 236. For instance, one LDMOS device 250 includes four butting contact plugs 236 in FIG. 9. The source region 220 includes a plurality of source doped regions 232 having the second conductive type, and a plurality of source contact regions 234 having the first conductive type therein, where the source doped regions 232 and the source contact regions 234 are alternately arranged. For instance, a source region 220 includes three source doped regions 232 and four source contact regions 234 therein in FIG. 9. The gate structure 116 includes a gate dielectric layer (not shown in the drawing), a gate electrode (not shown in the drawing) and a spacer structure (not shown in the drawing).

The LDMOS device 250 can further include a guard ring 140 having the first conductive type, two second isolation structures (not shown in the drawing), a high-voltage well 148 having the first conductive type, and a plurality of contact plugs 144. Since the positions of some components, such as the gate dielectric layer, the gate electrode, the spacer structure, the first isolation structure and the second insulate structure, are similar to their positions in the first preferred embodiment, the actual positions of these components are not shown in FIG. 9, and should be understood by a person skilled in this art.

The main difference between the second preferred embodiment and the first preferred embodiment lies in the source region 220. The two source contact regions 134 in the first preferred embodiment are disposed in front and in back of the source doped region 132 respectively. The source region 220 in the second preferred embodiment includes a plurality of source doped regions 232 and a plurality of source contact regions 234, where the source doped regions 232 and the source contact regions 234 are alternately arranged. Since the source contact regions 234 and the source doped regions 232 can be alternately arranged along the first direction 101, each of the butting contact plugs 236 can be disposed on the semiconductor substrate 110, substantially parallel with the gate structure 116, and each of the butting contact plugs 236 contacts with both the source contact regions 234 and the source doped regions 232. These butting contact plugs 236 can be arranged in a line along the direction of the gate structure 116, and each of the butting contact plugs 236 can contact with at least one of the source contact regions 234 and at least one of the source doped regions 232 in the meantime. In other words, the butting contact plugs 236 can be arranged in a line along the extended direction of the channel width of the LDMOS device 250.

Figure 10:
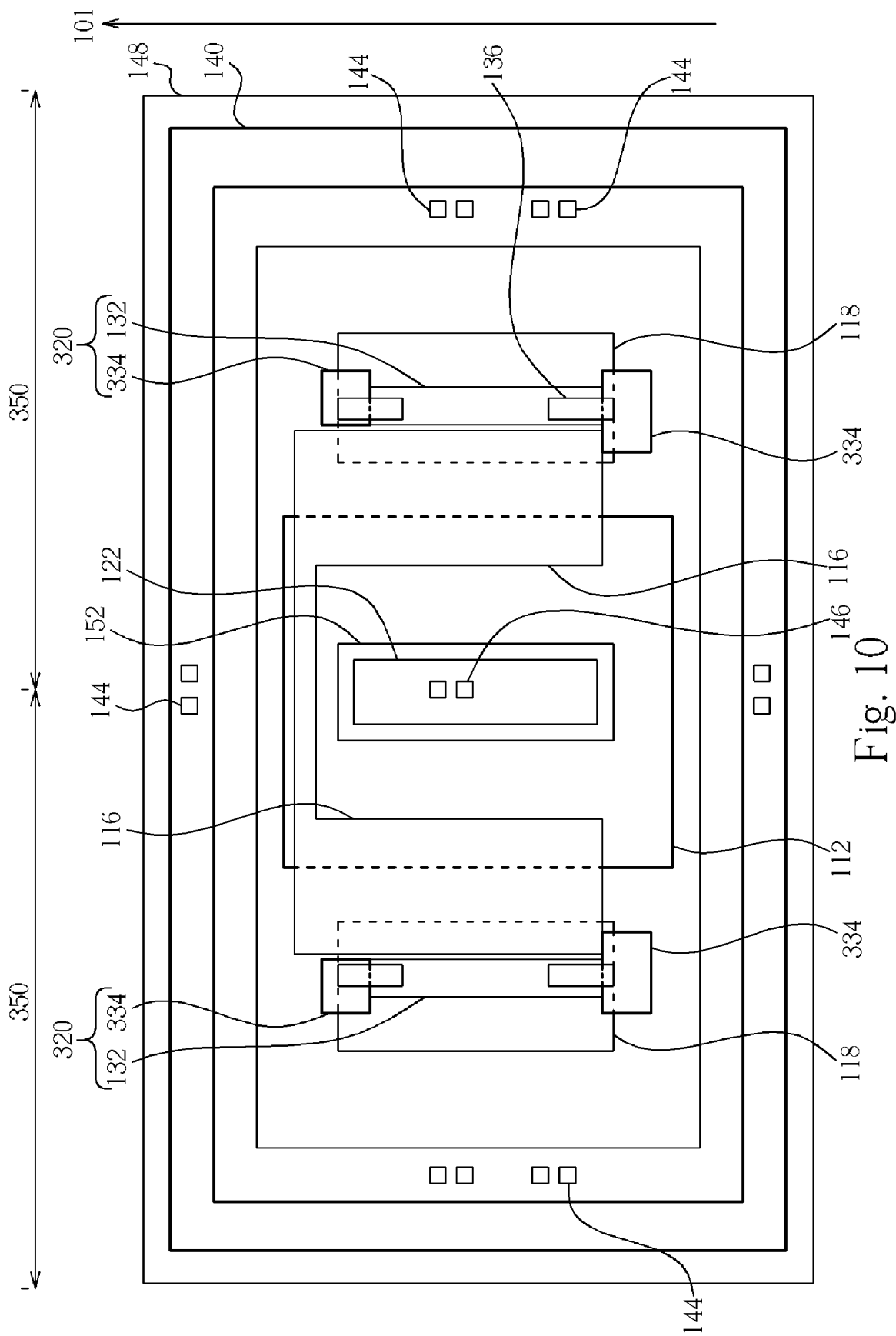
FIG. 10 is a schematic diagram illustrating a layout of an LDMOS device in accordance with a third preferred embodiment of the present invention.
Figure 11:
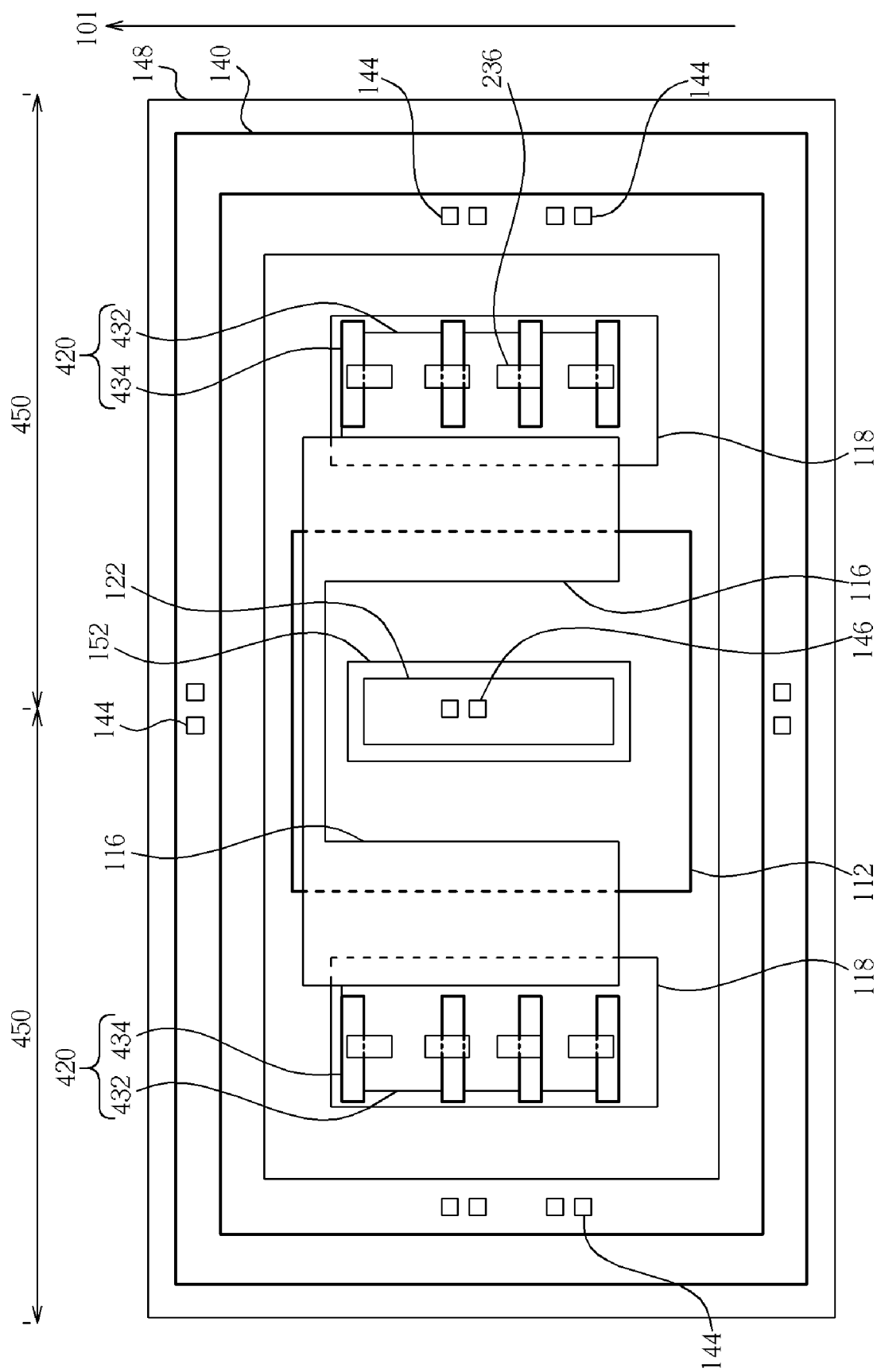
FIG. 11 is a schematic diagram illustrating a layout of an LDMOS device in accordance with a fourth preferred embodiment of the present invention.

Please refer to FIG. 10 and FIG. 11. FIG. 10 is a schematic diagram illustrating a layout of an LDMOS device 350 in accordance with a third preferred embodiment of the present invention, and FIG. 11 is a schematic diagram illustrating a layout of an LDMOS device 450 in accordance with a fourth preferred embodiment of the present invention. The source contact regions 134 and the source contact regions 234 disclosed in the second preferred embodiment and the first preferred embodiment might overlap the gate structure 116. However, the source contact region might not contact with the gate structure 116 in other embodiments, as shown in FIG. 10 and FIG. 11.

It should be noted that the structure of the third preferred embodiment is similar to the structure of the first preferred embodiment, and the structure of the fourth preferred embodiment is similar to the structure of the second preferred embodiment. The main difference is that the source contact regions 334 and the source contact regions 434 do not contact with the gate structure 116. Take the structure shown in FIG. 10 as an example, the source contact regions 334 of the source region 320 do not contact with the gate structure 116. Take the structure shown in FIG. 11 as an example, the source region 420 includes a source doped regions 432 and a plurality of source contact regions 434, and the source contact regions 434 do not contact with the gate structure 116. Observing along a direction parallel with the first direction 101, the source contact regions 434 and the source doped region 432 are alternately arranged along the first direction 101, and the source doped region 432 is positioned between each of the source contact regions 434. Observing according to a top view, each of the source contact regions 434 inserts in the source doped region 432.

Each butting contact plug disclosed in the above-mentioned embodiment contacts with only one source contact region and one source doped regions in the meantime. However, a single butting contact plug can electrically connect a plurality of source contact regions with a source doped region, or electrically connect a plurality of source contact regions with a plurality of source doped regions.

Figure 12:
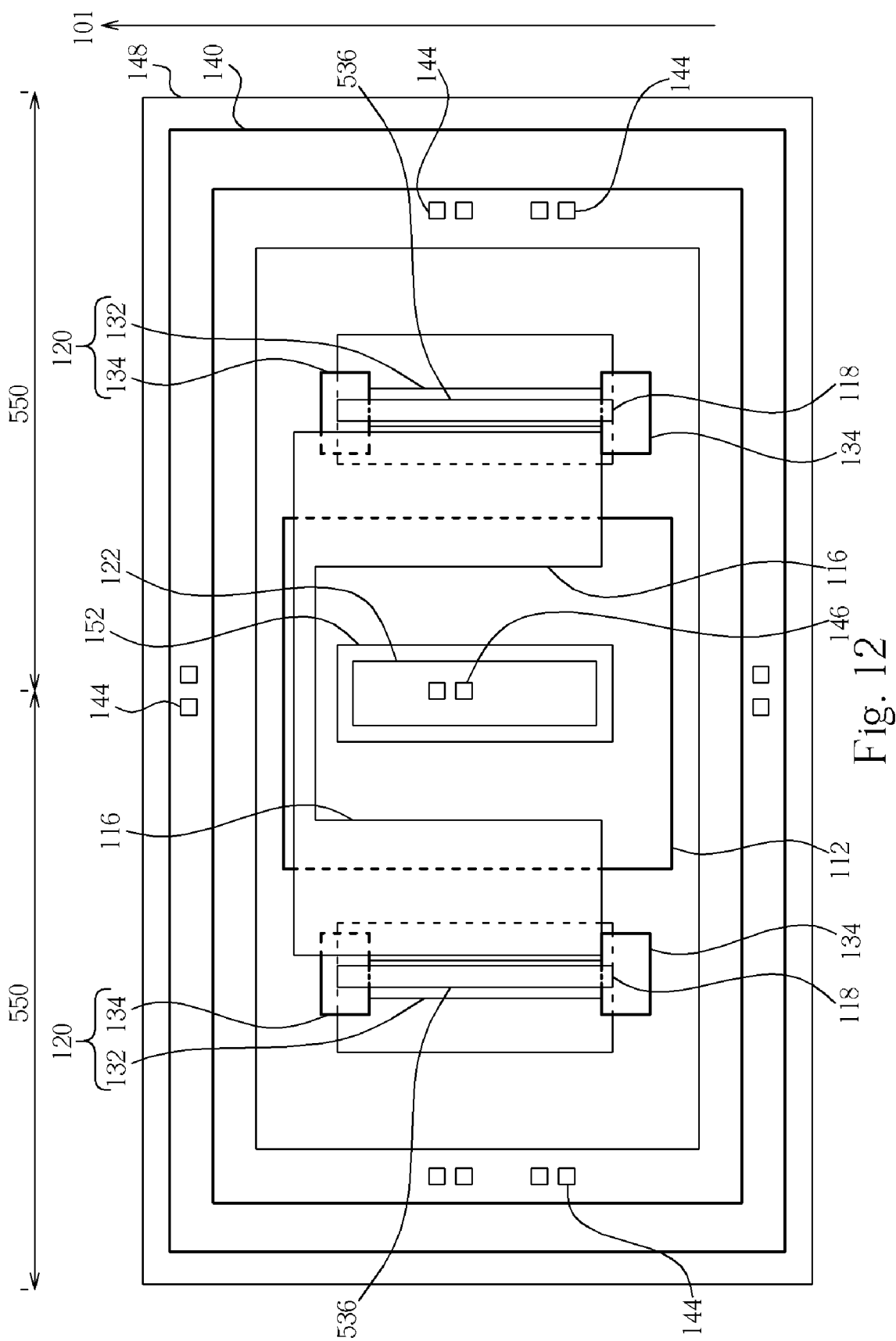
FIG. 12 is a schematic diagram illustrating a layout of an LDMOS device in accordance with a fifth preferred embodiment of the present invention.
Figure 13:
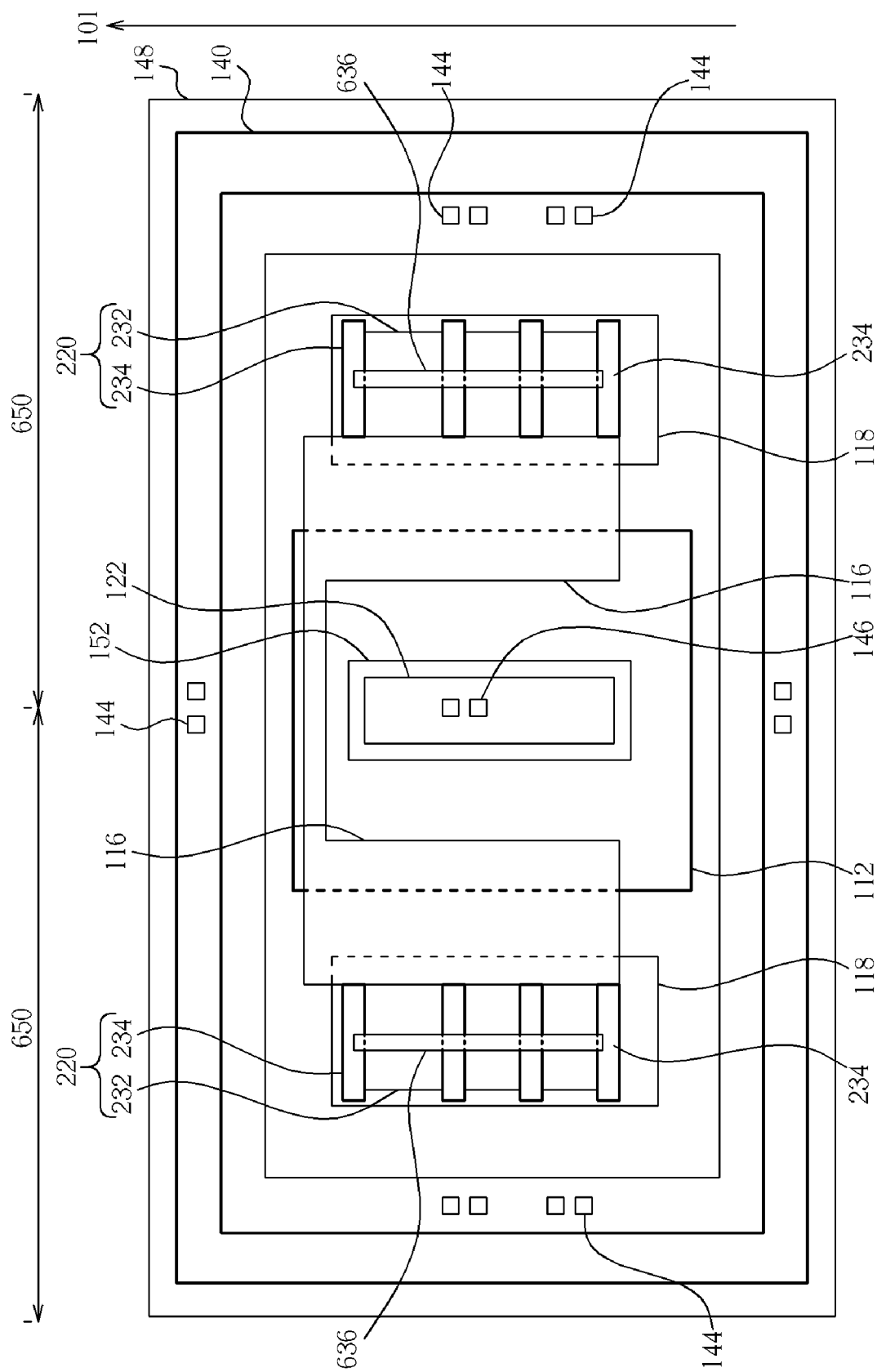
FIG. 13 is a schematic diagram illustrating a layout of an LDMOS device in accordance with a sixth preferred embodiment of the present invention.

Please refer to FIG. 12 and FIG. 13. FIG. 12 is a schematic diagram illustrating a layout of an LDMOS device 550 in accordance with a fifth preferred embodiment of the present invention, and FIG. 13 is a schematic diagram illustrating a layout of an LDMOS device 650 in accordance with a sixth preferred embodiment of the present invention. The structure of the fifth preferred embodiment is similar to the structure of the first preferred embodiment. The main difference between the fifth preferred embodiment and the first preferred embodiment is that single butting contact plug 536 can electrically connect two source contact regions 134 with a source doped region 132 in the LDMOS device 550. The structure of the sixth preferred embodiment is similar to the structure of the second preferred embodiment. The main difference between the sixth preferred embodiment and the second preferred embodiment is that single butting contact plug 636 can electrically connect four source contact regions 234 with three source doped regions 232 in the LDMOS device 650.

Figure 14:
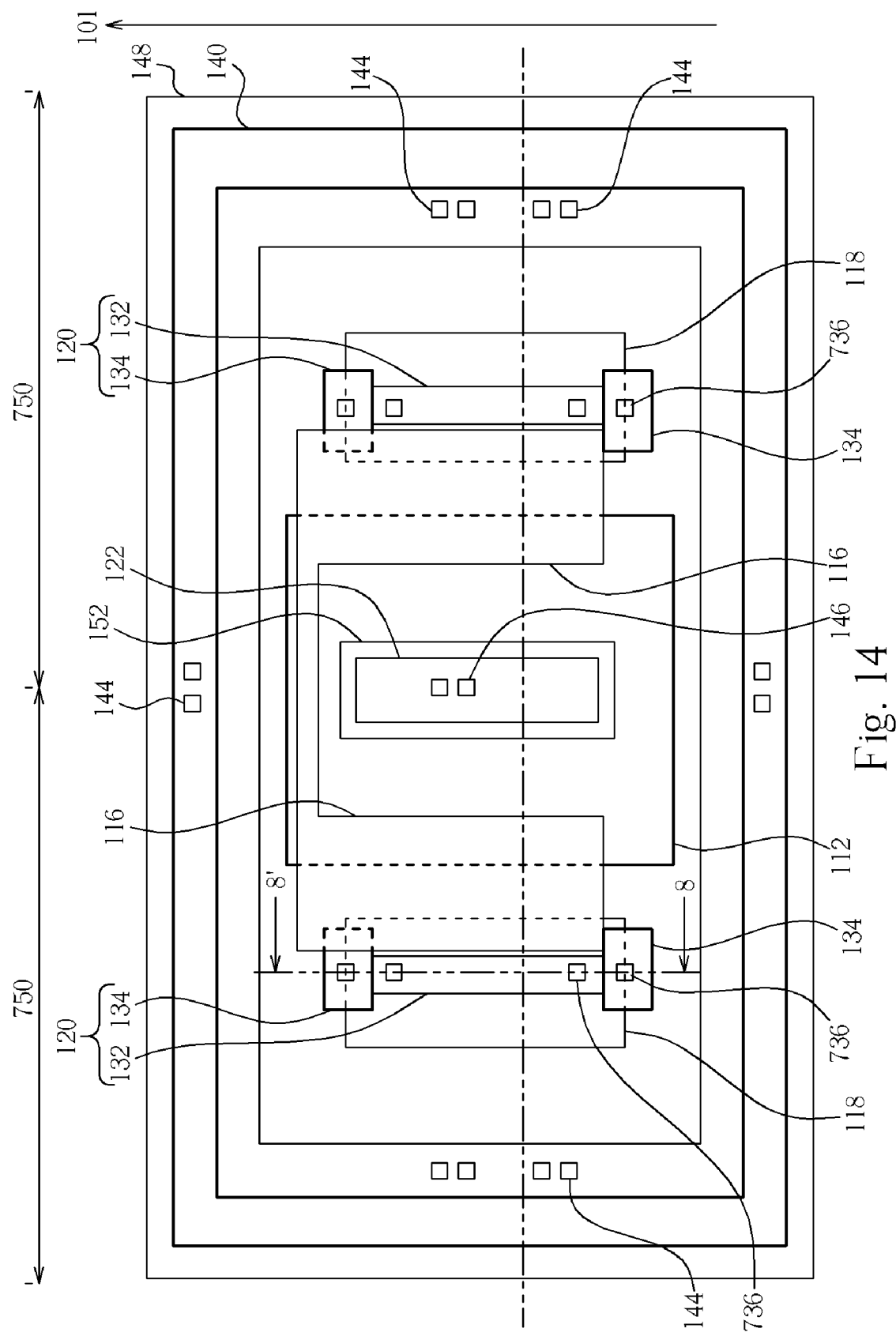
FIG. 14 is a schematic diagram illustrating a layout of an LDMOS device in accordance with a seventh preferred embodiment of the present invention.
Figure 15:
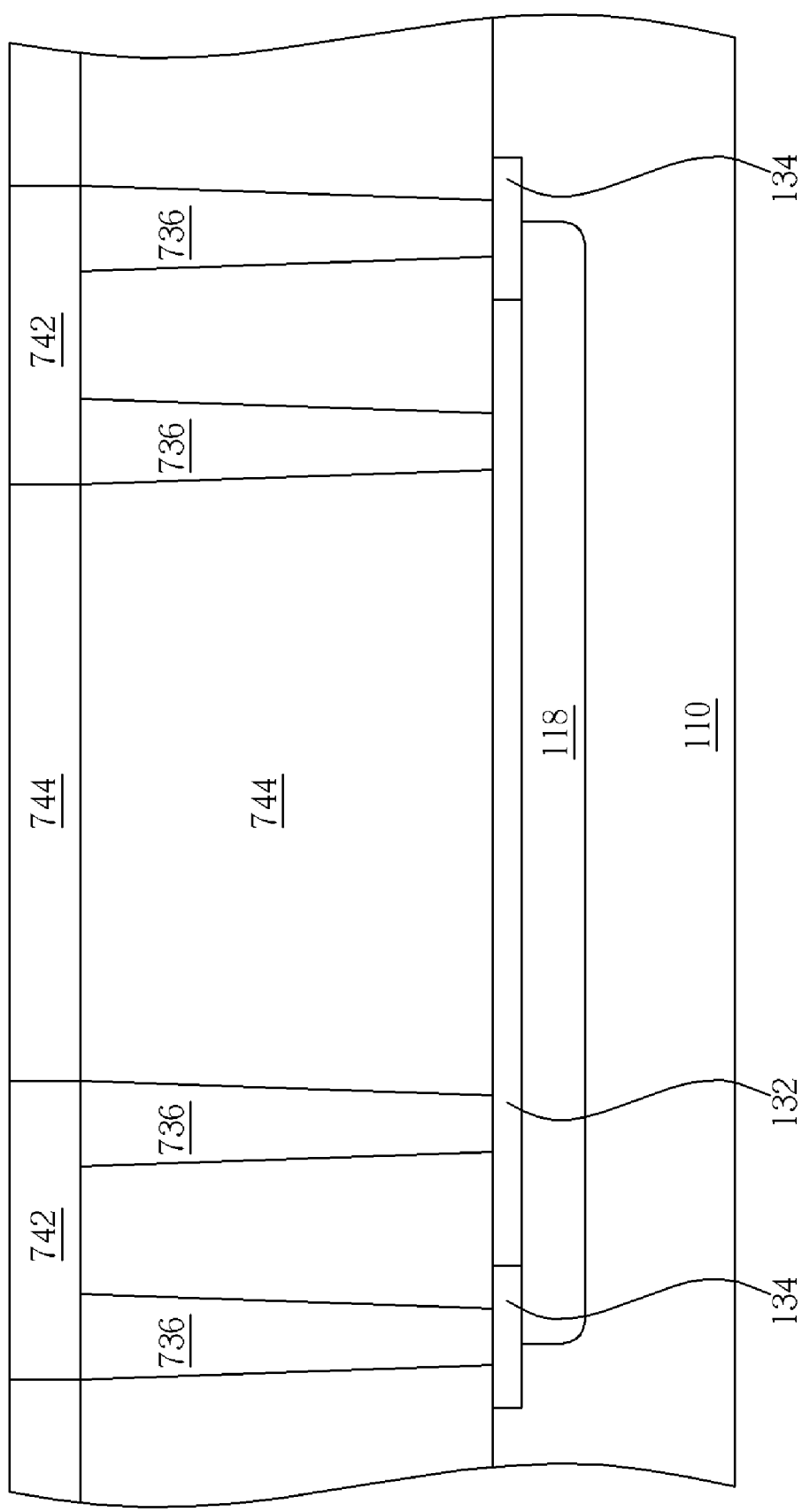
FIG. 15 is a schematic cross-sectional diagram illustrating the LDMOS device shown in FIG. 14 along a crossing line 8-8'.

In addition to the butting contact plug, the source contact region can be electrically connected to the source doped region through usual contact plugs and a metal interconnect structure of the integrated circuit in the present invention. Please refer to FIG. 14 and FIG. 15. FIG. 14 is a schematic diagram illustrating a layout of an LDMOS device 750 in accordance with a seventh preferred embodiment of the present invention, and FIG. 15 is a schematic cross-sectional diagram illustrating the LDMOS device 750 shown in FIG. 14 along a crossing line 8-8'. The structure of the seventh preferred embodiment is similar to the structure of the first preferred embodiment. The main difference between the seventh preferred embodiment and the first preferred embodiment is that the source contact regions are electrically connected to the source doped region through contact plugs and a metal interconnect structure of the integrated circuit in the seventh preferred embodiment, not through a butting contact plug.

As shown in FIG. 14, a plurality of butting contact plugs 736 are electrically connected to two source contact regions 134 and a source doped region 132 respectively in the LDMOS device 750. As shown in FIG. 15, the LDMOS device 750 can further include an interconnect structure 742 disposed in a dielectric material layer 744 to electrically connect the contact plug 736 of the source contact regions 134 with the contact plug 736 of the source doped region 132 according to the layout of this embodiment. The interconnect structure 742 can include any conductive material, such as copper, aluminum, tungsten. The dielectric material layer 744 can include any insulating material, such as undoped silicate glass (USG), phosphosilicate glass (PSG), borophosposilicate glass (BPSG), fluorinated silicate glass (FSG), carbon-doped oxide (CDO).

Figure 16:
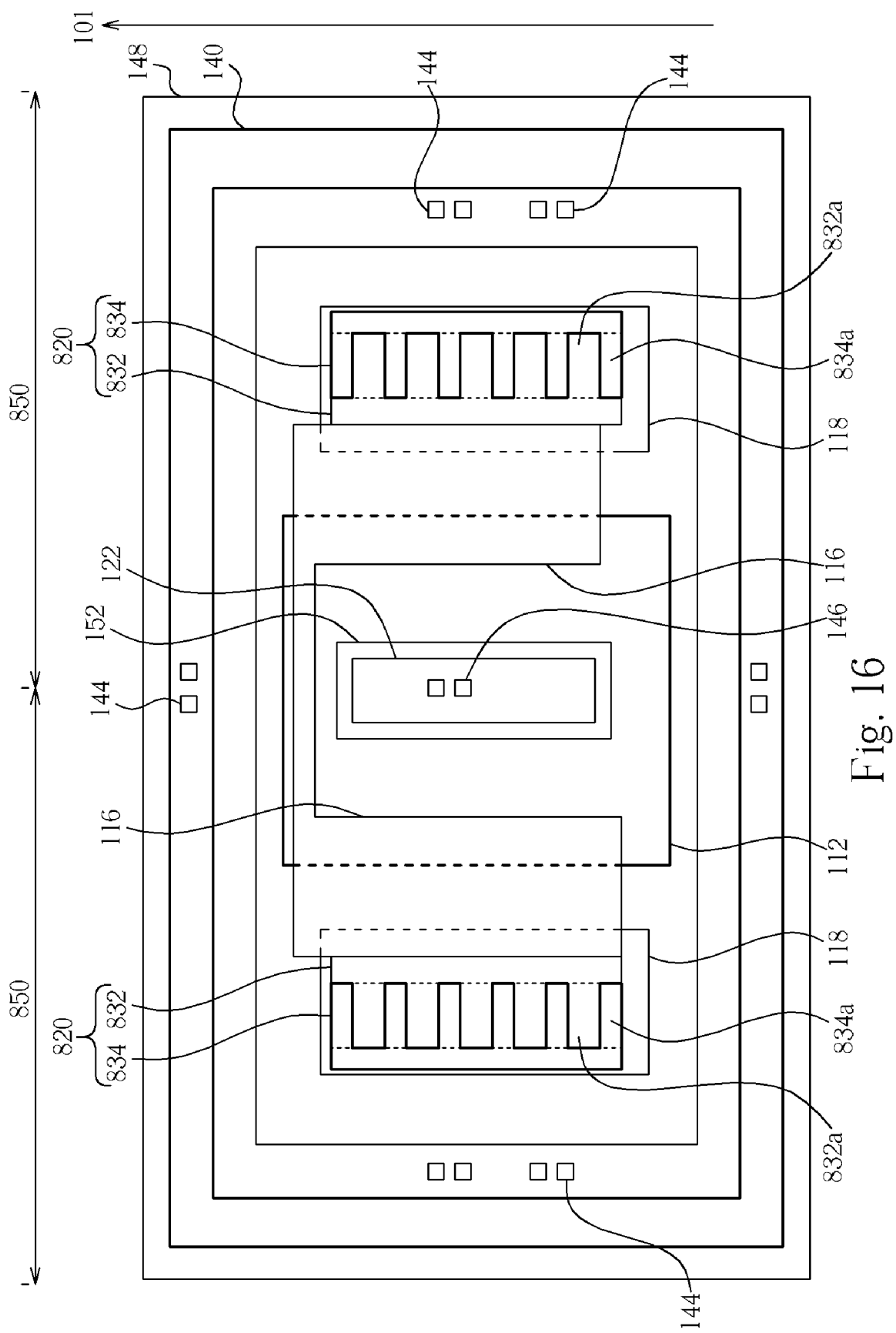
FIG. 16 through FIG. 18 are schematic diagrams illustrating layouts of an LDMOS device in accordance with an eighth preferred embodiment of the present invention.

Please refer to FIG. 16. FIG. 16 is a schematic diagram illustrating a layout of an LDMOS device 850 in accordance with an eighth preferred embodiment of the present invention. As shown in FIG. 16, the LDMOS device 850 in this embodiment includes a semiconductor substrate 110 having a first conductive type, a first well 112 having a second conductive type, a first isolation structure (not shown in the drawing), a gate structure 116, a second well 118 having the first conductive type, a source region 820 disposed in the second well 118, a drain region 122 having the second conductive type, a grade doped region 152 having the second conductive type, and at least a contact plug 146. The source region 820 includes a source doped region 832 having the second conductive type, and a source contact region 834 having the first conductive type therein. The gate structure 116 includes a gate dielectric layer (not shown in the drawing), a gate electrode (not shown in the drawing) and a spacer structure (not shown in the drawing).

The main difference between the eighth preferred embodiment and the fourth preferred embodiment lies in the shape of the source contact region. The source region 420 in the fourth preferred embodiment includes a plurality of source contact regions 434, and each source contact region 434 inserts in the source doped region 432. The source doped region 832 and the source contact region 834 in the eighth preferred embodiment are both comb-like structures, and the source doped region 832 and the source contact region 834 inserts into each other. Specifically speaking, a plurality of comb tooth parts 834a can be defined in the comb-like structure of the source contact region 834, and a plurality of comb tooth parts 832a can be defined in the comb-like structure of the source doped region 832. The comb tooth parts 834a of the source contact region 834 and the comb tooth parts 832a of the source doped region 832 can be alternately arranged along the first direction 101. Although these comb tooth parts are delineated by dotted lines in FIG. 16 for clarity of illustration, there need not be any discrete visible boundary between the comb tooth parts in the actual body.

Figure 17:
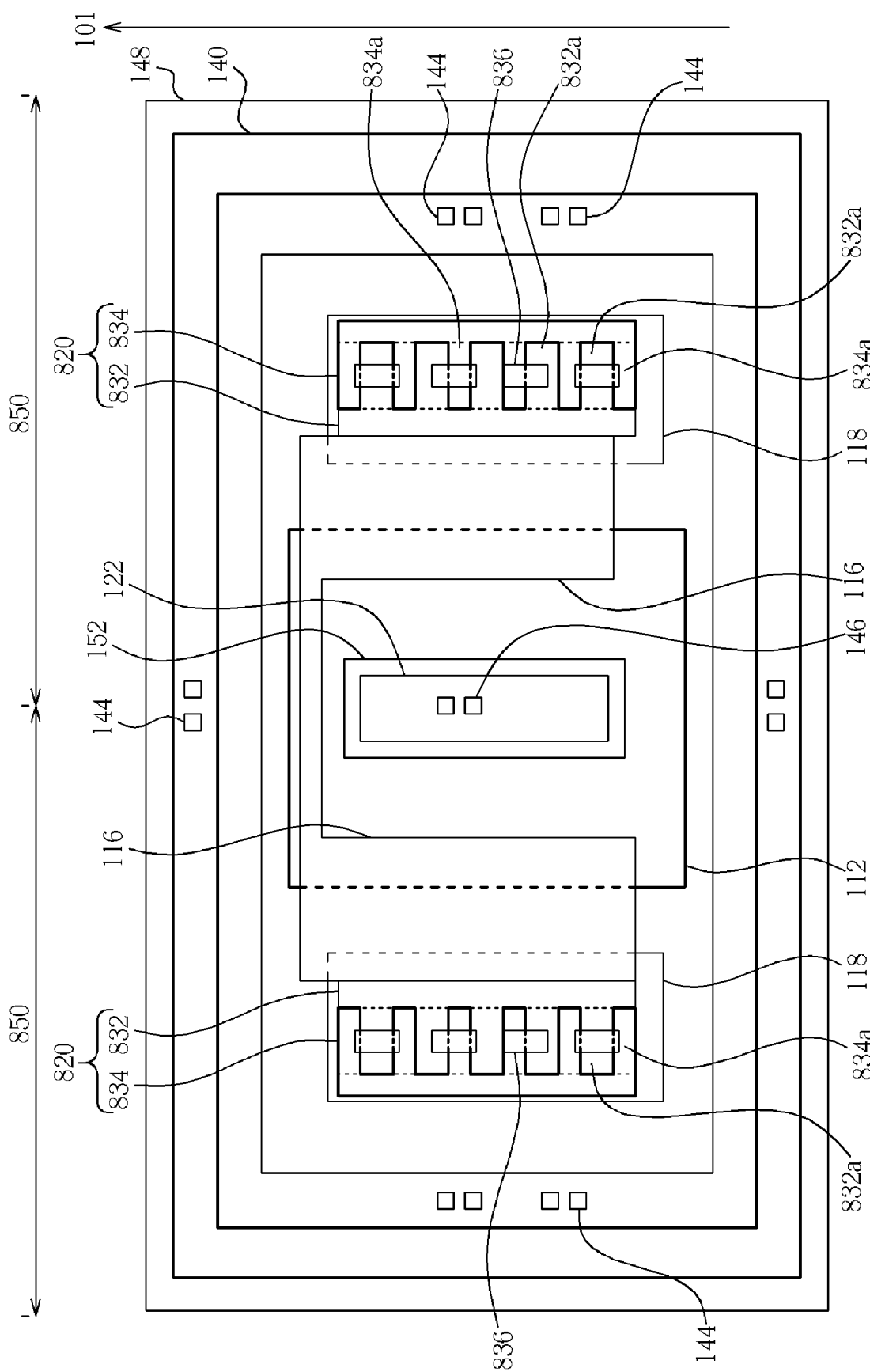
Figure 18:
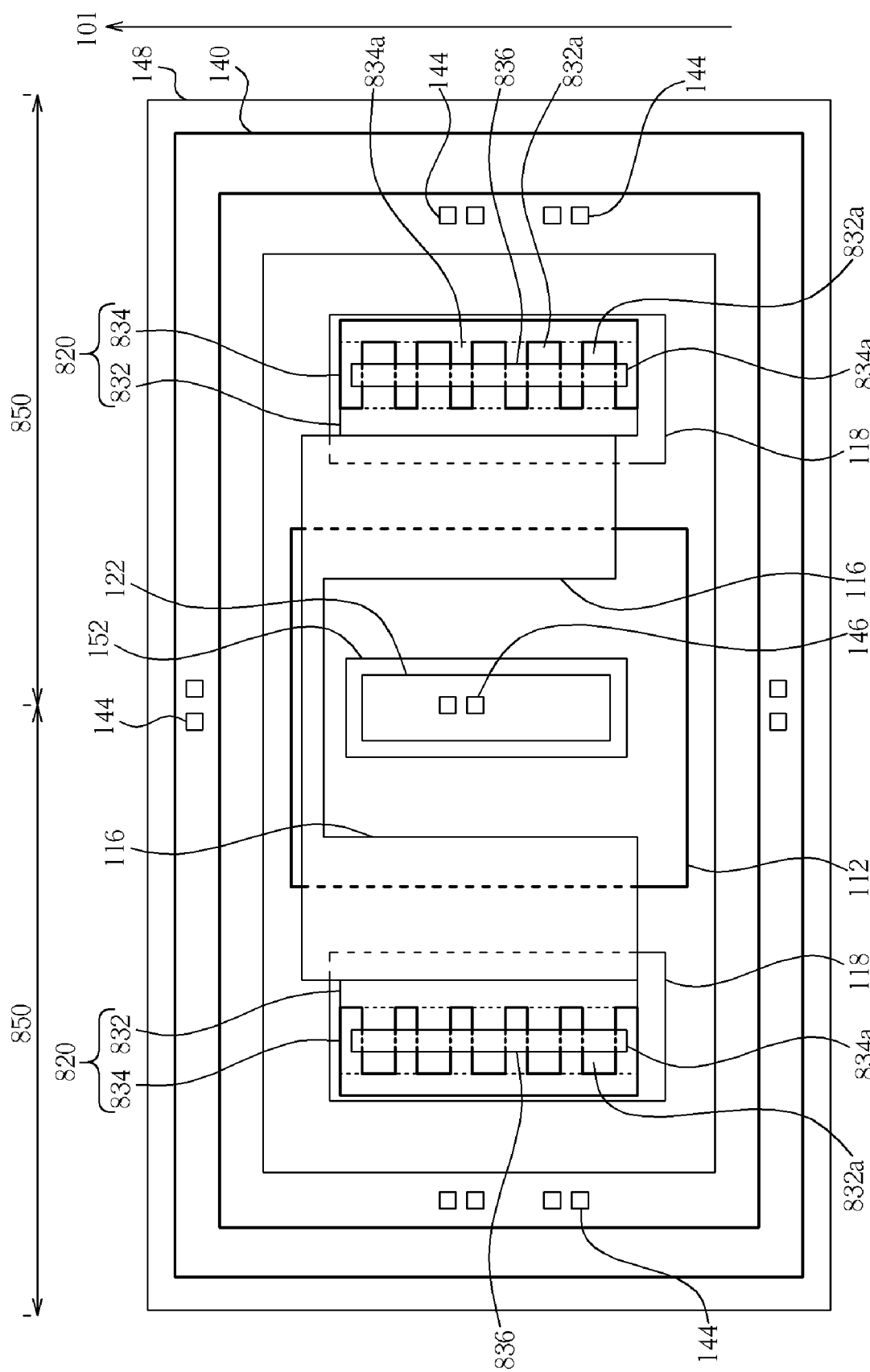

According to the above-mention embodiments, it should be known to those skilled in this art that the source doped region 832 and the source contact region 834 can be electrically connected to each other through at least a butting contact plug 836 in the LDMOS component 850. As shown in FIG. 17, an LDMOS device 850 includes four butting contact plugs 836. Each of the butting contact plugs 836 is disposed on the semiconductor substrate 110, and substantially parallel with the gate structure 116. These butting contact plugs 836 can be arranged in a line along the direction of the gate structure 116, and each of the butting contact plugs 836 can contact with the source contact region 834 and the source doped region 832 in the same time. Otherwise, as shown in FIG. 18, an LDMOS device 850 includes a butting contact plug 836. The butting contact plug 836 is disposed on the semiconductor substrate 110, and substantially parallel with the gate structure 116.

Figure 19:
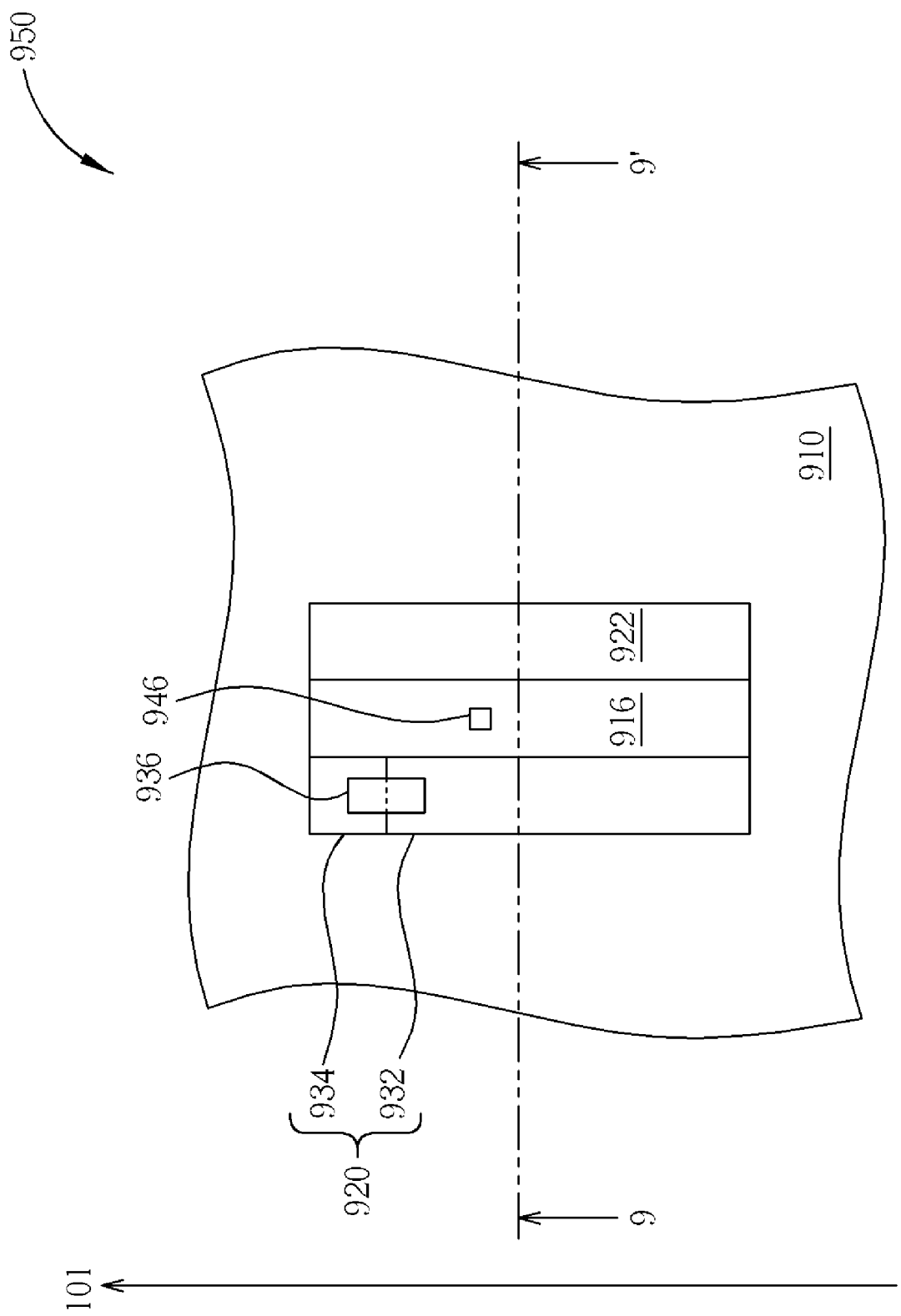
FIG. 19 is a schematic diagram illustrating a layout of an LDMOS device in accordance with a ninth preferred embodiment of the present invention.
Figure 20:
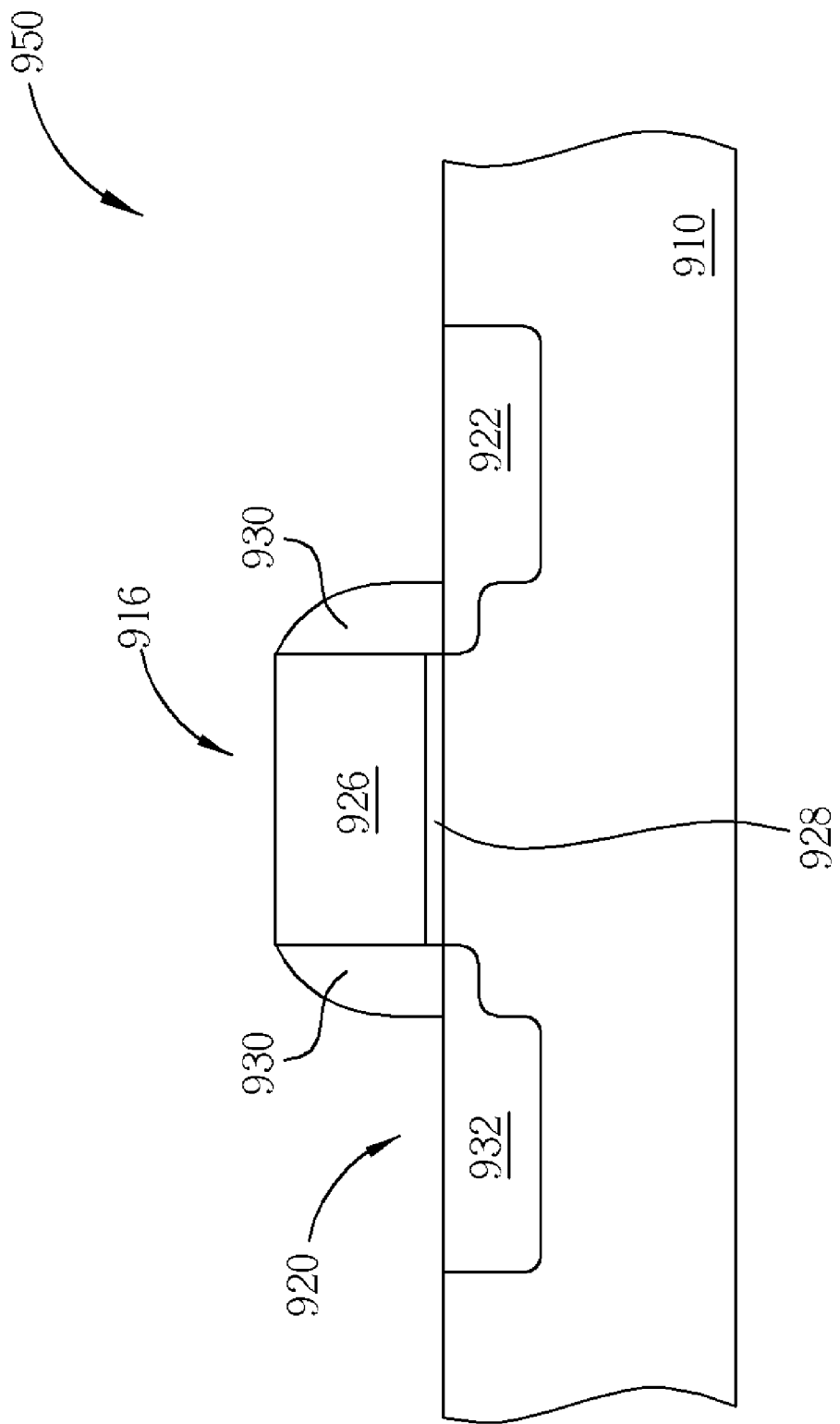
FIG. 20 is a schematic cross-sectional diagram illustrating the LDMOS device shown in FIG. 19 along a crossing line 9-9'.

On the other hand, the present invention can also be applied to other types of MOS devices. Please refer to FIG. 19 and FIG. 20. FIG. 19 is a schematic diagram illustrating a layout of an LDMOS device 950 in accordance with a ninth preferred embodiment of the present invention, and FIG. 20 is a schematic cross-sectional diagram illustrating the LDMOS device 950 shown in FIG. 19 along a crossing line 9-9'. As shown in FIG. 19 and FIG. 20, the LDMOS device 950 in this embodiment includes a semiconductor substrate 910 having a first conductive type, a gate structure 916, a source region 920, a drain region 922 having the second conductive type, at least a contact plug 946, and at least a butting contact plug 936. The source region 920 includes a source doped region 932 having the second conductive type, and a source contact region 934 having the first conductive type therein. The gate structure 916 includes a gate dielectric layer 928, a gate electrode 926 and a spacer structure 930.

The gate structure 916 is disposed on the semiconductor substrate 910, and substantially parallel with a first direction 101. The drain region 922 and the source region 920 are both disposed in the semiconductor substrate 910, and on two opposite sides of the gate structure 916 respectively. The gate dielectric layer 928 is disposed on the surface of the semiconductor substrate 910, and the gate electrode 926 is disposed on the gate dielectric layer 928. The spacer structure 930 surrounds partial sidewalls of the gate electrode 926 and the gate dielectric layer 928. The contact plug 946 is disposed on the surface of the gate electrode 926, and is electrically connected to the gate electrode 926 so as to control the voltage of the gate. It should be noted that the source contact region 934 and the source doped region 932 are alternately arranged along the first direction 101. Thus, the butting contact plug 936 can be disposed on the semiconductor substrate 910, substantially parallel with the gate structure 916, and contacts with both the source contact region 934 and the source doped region 932.

According to the above-mentioned layouts, while length of the first well, length of the first isolation structure, length of the gate structure, length of the drain region, length of the shallow doped region and length of the source doped region are unchanged, and distances between these components are not changed either, the positions or shapes of the source contact region or the source doped region is changed in the present invention so that the source contact region and the source doped region are alternately arranged along the gate direction. As a result, the length of the source region and the length of the second well are shortened, and the performance of the MOS device is protected in the meantime. Therefore, the LDMOS device of the present invention can have a shorter layout length, and the integration level of the integrated circuit is improved. On other hand, the layout of the present invention will not damage the operation of the LDMOS device, and even reduce the Rdson value of the LDMOS device. Thus, the performance of MOS device is effectively increased.

Those skilled in the art will readily observe that numerous modifications and alterations of the device and method may be made while retaining the teachings of the invention.

What is claimed is:

1. A metal-oxide-semiconductor (MOS) device, comprising:

a semiconductor substrate having a first conductive type;

a gate structure, disposed on the semiconductor substrate, substantially parallel with a first direction;

a drain region having a second conductive type, disposed in the semiconductor substrate;

a source region, disposed in the semiconductor substrate, the drain region and the source region are disposed on two opposite sides of the gate structure, the source region comprising:

- at least a source doped region having the second conductive type, disposed on a side of the gate structure; and
- a plurality of source contact regions having the first conductive type, the source contact regions and the source doped region being alternately arranged along the first direction; and a channel region, disposed in the semiconductor substrate under the gate structure, and between the source region and the drain region, wherein the channel region has a channel width, and the first direction is an extended direction of the channel width.

2. The MOS device of claim 1, wherein the source region comprises two source contact regions, and the source contact regions are disposed on two opposite sides of the source doped region.

3. The MOS device of claim 1, wherein the source region comprises a plurality of source doped regions, and the source contact regions and the source doped regions are alternately arranged along the first direction.

4. The MOS device of claim 1, wherein each of the source contact regions inserts in the source doped region.

5. The MOS device of claim 1, wherein the MOS device is a laterally diffused metal oxide semiconductor (LDMOS) device.

6. The MOS device of claim 5, further comprising:

- a first well having the second conductive type, disposed in the semiconductor substrate, covering a portion of the drain region;
- an isolation structure, disposed on a top portion of the first well, positioned between the drain region and the source region; and
- a second well having the first conductive type, disposed in the semiconductor substrate on the other side of the isolation structure opposite to the drain region, covering a portion of the source region.

7. The MOS device of claim 6, wherein the first well covers a bottom portion of the isolation structure.

8. The MOS device of claim 6, wherein the gate structure comprises:

- a gate dielectric layer, disposed on a surface of the semiconductor substrate between the isolation structure and the source region; and
- a gate electrode, disposed on the gate dielectric layer and a portion of the isolation structure.

9. The MOS device of claim 6, further comprising a grade doped region having the first conductive type, disposed in the first well under the drain region.

10. The MOS device of claim 1, wherein the first conductive type is P-type, and the second conductive type is N-type.

11. The MOS device of claim 1, wherein the MOS device further comprises a plurality of contact plugs and an interconnect structure, and the source contact regions and the source doped region are electrically connected to each other through the contact plugs and the interconnect structure.

* * * * *